(12) United States Patent
Abbasi et al.

(10) Patent No.: US 11,128,327 B2
(45) Date of Patent: Sep. 21, 2021

(54) PRINCIPLE AND TECHNIQUES FOR INTEGRATED TRX SWITCH

(71) Applicant: Integrated Device Technology, Inc., San Jose, CA (US)

(72) Inventors: Morteza Abbasi, Carlsbad, CA (US); Tumay Kanar, Carlsbad, CA (US); Naveen Krishna Yanduru, San Diego, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 16/558,055

(22) Filed: Aug. 31, 2019

(65) Prior Publication Data
US 2021/0067183 A1 Mar. 4, 2021

(51) Int. Cl.
*H04B 1/04* (2006.01)
*H03H 7/01* (2006.01)
*H03F 1/56* (2006.01)

(52) U.S. Cl.
CPC .......... *H04B 1/0458* (2013.01); *H03F 1/565* (2013.01); *H03H 7/1791* (2013.01); *H03F 2200/222* (2013.01); *H03F 2200/387* (2013.01)

(58) Field of Classification Search
CPC .... H04B 1/0458; H03H 7/1791; H03F 1/565; H03F 2200/387; H03F 2200/222
See application file for complete search history.

(56) References Cited

U.S. PATENT DOCUMENTS

| | | | |
|---|---|---|---|
| 2007/0232241 A1* | 10/2007 | Carley | H04B 1/44 455/83 |
| 2013/0207872 A1* | 8/2013 | Bakalski | H03H 7/40 343/860 |
| 2020/0083924 A1* | 3/2020 | Callender | H03F 1/565 |

\* cited by examiner

*Primary Examiner* — Yuwen Pan
*Assistant Examiner* — Fatuma G Sherif
(74) *Attorney, Agent, or Firm* — Christopher P. Maiorana, PC

(57) ABSTRACT

An apparatus includes a transceiver circuit, a series capacitor, and a shunt switch. The transceiver circuit may comprise a transmit chain including an output matching network and a receive chain including an input matching network. An output of the output matching network may be connected directly to an input/output of the transceiver circuit. The series capacitor may be connected between an input of the input matching network and the output of the output matching network. The shunt switch may be connected between the input of the input matching network and a circuit ground potential of the transceiver circuit.

20 Claims, 12 Drawing Sheets

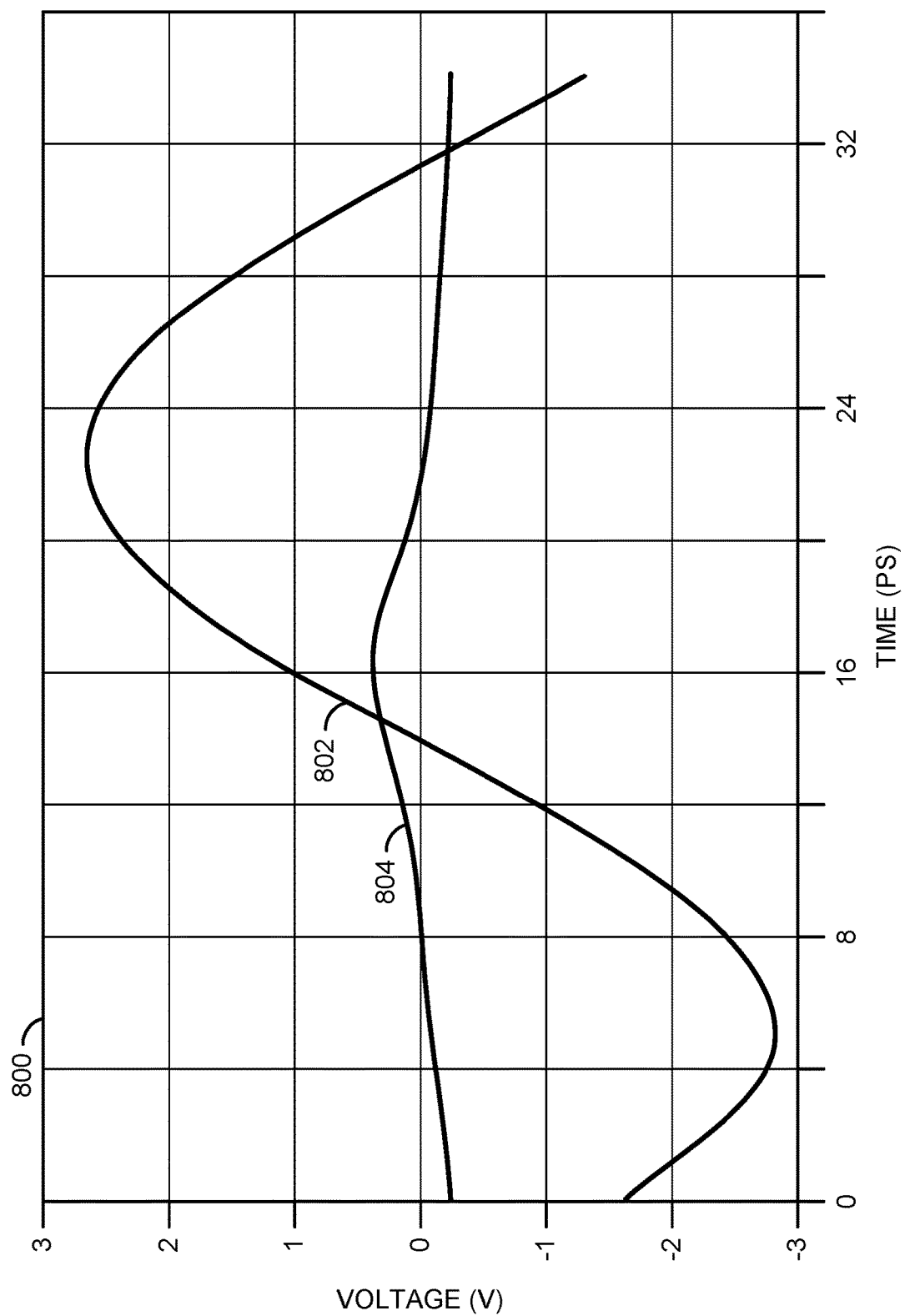

PRINCIPLE AND TECHNIQUES FOR INTEGRATED TRX SWITCH

FIELD OF THE INVENTION

The invention relates to transceiver circuits generally and, more particularly, to a method and/or apparatus for implementing an integrated transmit-receive (TRX) switch.

BACKGROUND

Conventional high isolation transmit-receive (TRX) switch implementations add to chip area and add to loss (i) at the output of the transmit chain (i.e. return loss, insertion loss, or power loss) and (ii) at the input of the receive chain (i.e., noise factor, added loss and noise). Conventional high isolation TRX switches require active technologies that can withstand high voltages, which would limit linearity of the transmit chain.

It would be desirable to implement an integrated transmit-receive (TRX) switch without affecting performance of the transmit and receive chains.

SUMMARY

The invention concerns an apparatus including a transceiver circuit, a series capacitor, and a shunt switch. The transceiver circuit may comprise a transmit chain including an output matching network and a receive chain including an input matching network. An output of the output matching network may be connected directly to an input/output of the transceiver circuit. The series capacitor may be connected between an input of the input matching network and the output of the output matching network. The shunt switch may be connected between the input of the input matching network and a circuit ground potential of the transceiver circuit.

BRIEF DESCRIPTION OF THE FIGURES

Embodiments of the invention will be apparent from the following detailed description and the appended claims and drawings in which:

FIG. 12 is a diagram illustrating simulated voltage waveforms of the TRX switch topology of FIG. 11.

DETAILED DESCRIPTION OF THE EMBODIMENTS

Embodiments of the present invention include providing an integrated transmit-receive (TRX) switch that may (i) combine output and input impedance matching networks of a transceiver circuit with additional series and shunt capacitors to implement a high isolation switch, (ii) be used in differential applications, (iii) be used in single-ended applications, (iv) eliminate need for high breakdown devices in TRX switches, (v) be suitable for implementation in advanced low voltage submicron transistor technologies, (vi) be absorbed into the impedance matching elements of a power amplifier and/or low-noise amplifier, (vii) reduce chip area, (viii) be used in transformer based transmitter and receiver implementations, (ix) be suitable for implementation in short-channel bulk or Silicon-on-Insulator (SOI) CMOS technology with low breakdown voltage, (x) provide high isolation between transmit (TX) and receive (RX) circuits, (xi) be designed independently of the TX and RX circuits, (xii) be absorbed into respective impedance matching networks at any stage of development with no co-design or co-optimization, and/or (xiii) be suitable for any transceiver that has to operate in transmit and receive modes at different times and requires isolation between the two.

Figure 1:
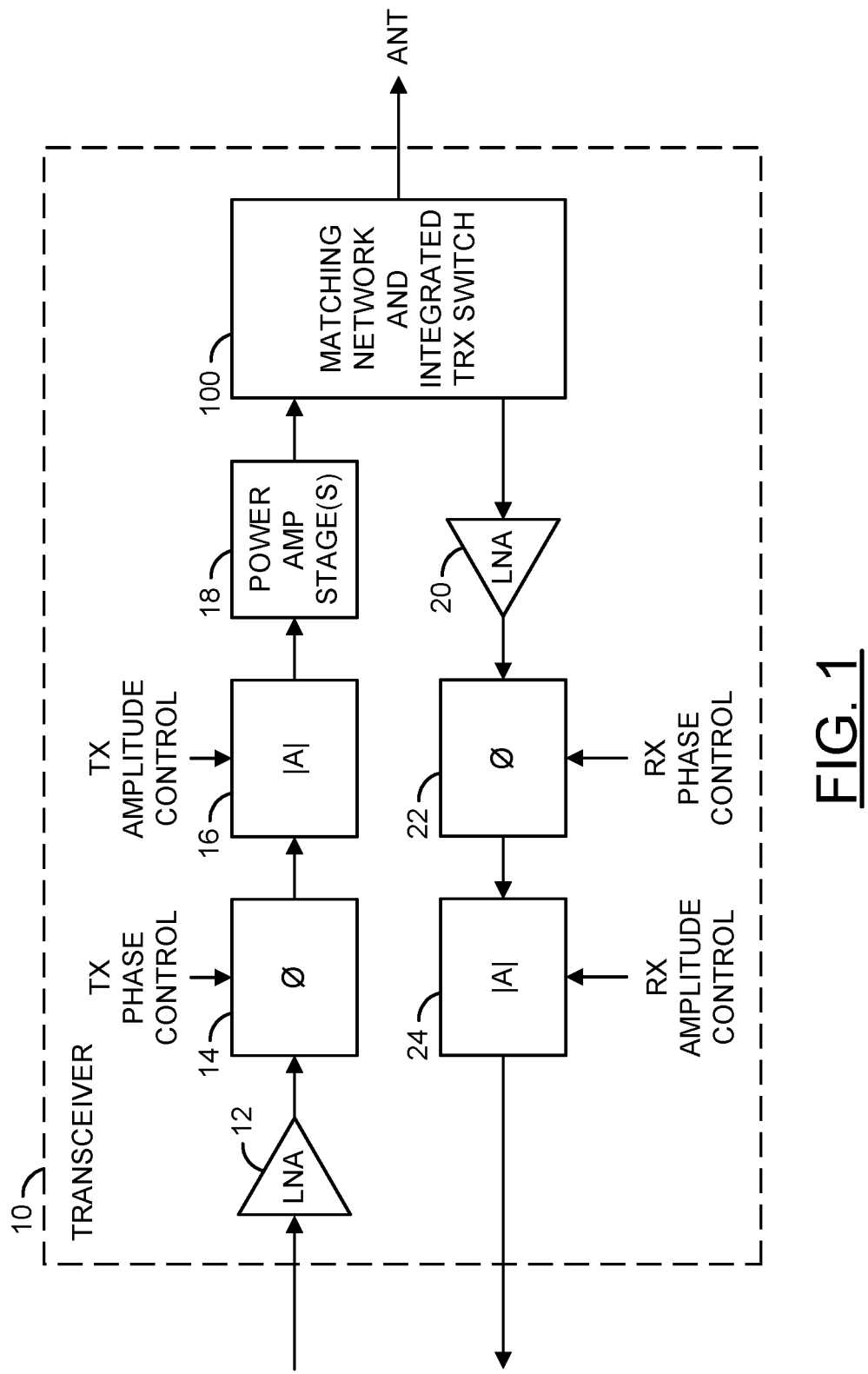
FIG. 1 is a diagram of a transceiver circuit illustrating an example context of the invention.

Referring to FIG. 1, a block diagram of a circuit 10 is shown illustrating an example context in which a transmit-receive (TRX) switch in accordance with an example embodiment of the invention may be implemented. In an example embodiment, the circuit 10 may implement a transceiver circuit. A transceiver is generally capable of both transmitting and receiving signals of a communication channel. In various embodiments, the circuit 10 may be capable of transmitting and receiving radio frequency (RF), microwave, and/or millimeter-wave signals. In various embodiments, the circuit 10 may be representative of transceiver circuits utilized in applications including, but not limited to cellular base stations (e.g., 2G, 3G, 4G, 5G, etc.), wireless communication systems, wireless local area networks (WLANs), wireless backhaul channels, broadband repeaters, community antenna television (CATV) networks, macro cells, micro cells, pico cells, femto cells, mobile devices (MDs), and/or portable handheld devices (UEs). In some embodiments, the circuit 10 may be representative of a radar application including, but not limited to target detection, ranging, and/or through-wall imaging.

In an example, the transceiver circuit 10 generally comprises both a transmitter chain and a receiver chain. Both the transmitter chain and the receiver chain may comprise radio frequency (RF) amplifiers. In an example, the transmitter chain may include an input amplifier 12, a variable phase shifter 14, a variable attenuator 16, and one or more output amplifier stages 18. In an example, the input amplifier 12 may be implemented as a low noise amplifier (LNA). The output amplifier stages 18 may include drivers, pre-amplifiers, and/or power amplifiers. In an example, the receiver chain may include an input amplifier 20, a variable phase shifter 22, and a variable attenuator 24. The input amplifier 20 may be implemented as a low noise amplifier (LNA). In an example, an output of the transmitter chain and an input of the receiver chain may be coupled to a transmission line or an antenna by an integrated transmit-receive (TRX) switch 100 implemented in accordance with an embodiment of the invention. In various embodiments, the integrated TRX switch 100 may combine output and input impedance matching networks of the transceiver circuit with additional series and shunt capacitors to implement a high isolation switch. A topology of the integrated TRX switch 100 may be applied to differential and single-ended applications. The integrated TRX switch 100 generally eliminates the need for high breakdown devices in high isolation TRX switches. The integrated TRX switch 100 is generally suitable for any transceiver that has to operate in transmit and receive modes at different times and requires isolation between the two.

Figure 2:
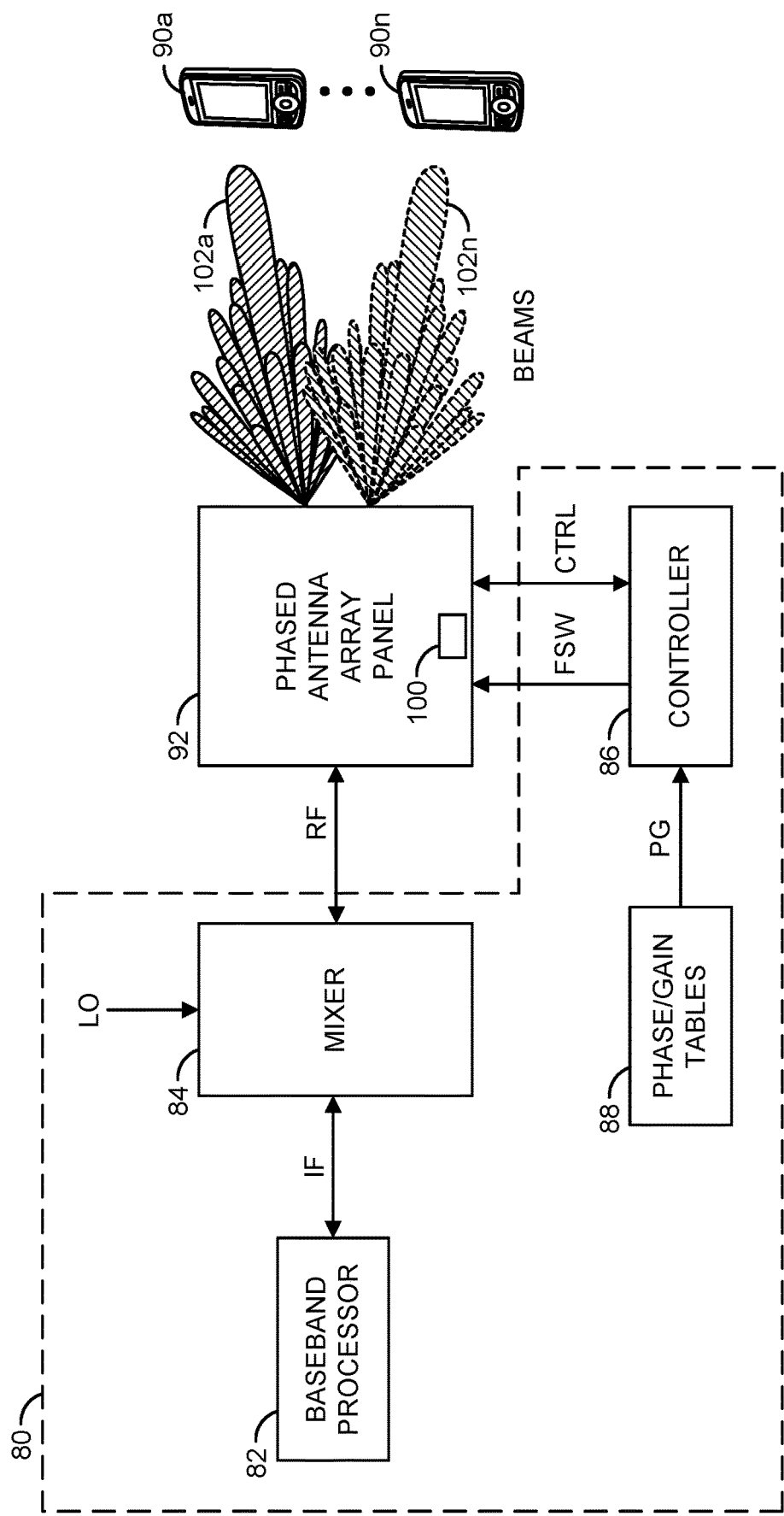
FIG. 2 is a diagram of a phased array antenna system illustrating another example context of the invention.

Referring to FIG. 2, a block diagram of a system 80 is shown illustrating another example context of the invention. The system (or module or circuit or apparatus) 80 may implement a radio-frequency (RF) transceiver system in accordance with an example embodiment of the invention. The RF transceiver system 80 may be configured to operate at common wireless radio frequencies, millimeter-wave frequencies, and/or microwave frequencies. In an example, the RF transceiver system 80 may be configured to facilitate communication with and/or between a plurality of communications devices (or terminals) 90a-90n. In an example, the communications devices 90a-90n may include, but are not limited to, cellular telephones, mobile devices, tablets, internet-of-things (IoT) equipment, etc. In various embodiments, the RF transceiver system 80 and the communications devices 90a-90n may be coupled using at least one phased array antenna panel 92. The phased array antenna panel 92 may include a number of antenna elements and a number of beam former circuits (or chips), which are described below in connection with FIGS. 3-7. The beam former circuits may comprise integrated transmit-receive (TRX) switches 100 in accordance with an example embodiment of the invention.

In an example, the RF transceiver system 80 may form part of a communications link. In some embodiments, the communications link may be part of a fifth generation (5G) wireless communications system (e.g., for which a standard is currently under development by the Next Generation Mobile Networks (NGMN) Alliance). In other embodiments, the communications link may be part of systems including, but not limited to, a fourth generation (4G) wireless communications system (e.g., International Mobile Telecommunications-Advanced (IMT-A) standard published by the International Telecommunications Unit Radio-communication Sector (ITU-R)), a satellite communication (SATCOM) system, and point-to-point communications systems such as common data link (CDL). However, other communications standards may be implemented to meet the design criteria of a particular application.

In an example, the RF transceiver system 80 may comprise a block (or circuit) 82, a block (or circuit) 84, a block (or circuit) 86, and a block (or circuit) 88. In various embodiments, the blocks 82-88 may be implemented with hardware, a combination of hardware and software, and/or simulated with software. A signal (e.g., IF) may be exchanged between the circuit 82 and the circuit 84. The signal IF may implement an intermediate-frequency signal. In an example, the signal IF may be configured (e.g., using various modulation schemes) to carry information to be transmitted from and/or received by the RF transceiver system 80. In an example, a signal (e.g., LO) may be presented to the circuit 84. The signal LO may implement a local oscillator signal. A signal (e.g., RF) may be exchanged between the circuit 84 and the phased array antenna panel 92. The signal RF may be a radio-frequency, millimeter-wave frequency, or microwave frequency signal that conveys the information also found in the intermediate-frequency signal IF.

In a transmit mode, the radio-frequency signal RF may convey information to be broadcast from the phased array antenna panel 92 to the devices 90a-90n. In a receive mode, the radio-frequency signal RF may convey information received from the devices 90a-90n via the phased array antenna panel 92. A signal (e.g., FSW) and a signal or signals (e.g., CTRL) may be exchanged between the circuit 86 and the phased array antenna panel 92. The signal FSW may switch the phased array antenna panel 92 between the transmit mode and the receive mode. The signal(s) CTRL may convey data, clocking, and control elements. In an example, the signals FSW and CTRL may be part of a digital interface of the phased array antenna panel 92. In an example, the signal(s) CTRL may be implemented as a serial link that conveys information for configuring and/or determining phase and/or gain settings for antenna elements of the phased array antenna panel 92. In an example, the signal(s) CTRL may be compliant with one or more serial communication protocols or interfaces (e.g., serial peripheral interface (SPI), inter-integrated circuit communications (I2C), daisy chain, etc.). A signal or signals (e.g., PG) may be transferred from the circuit 88 to the circuit 86. In an example, the signal(s) PG may convey phase information and gain information used by the circuit 86 to implement (control) beam steering using the phased array antenna panel 92. In an example, the signal(s) PG may convey a plurality of phase and gain values that may be programmed into a plurality of beam former circuits of the phased array antenna panel 92 via the signal(s) CTRL.

The phased array antenna panel 92 generally implements a hard-wired address scheme. The hard-wired address scheme may be used to uniquely identify serial communications intended for elements (e.g., the beam former circuits) of the phased array antenna panel 92. In various embodiments, multiple phased array antenna panels 92 may be combined to form a larger antenna array that may provide more transmission channels. The multiple phased array antenna panels 92 may share a serial communication channel, link, or bus. Each of the phased array antenna panels 92 making up the larger antenna array may be uniquely addressed using respective hard-wired addresses.

The phased array antenna panel 92 may generate one or more fields (or beams) 102a-102n. The fields 102a-102n may represent a field pattern (or radio-frequency beam pattern) created by the beam former circuits of the phased array antenna panel 92 based upon the phase and gain information (values) received via the signal(s) CTRL. The phased array antenna panel 92 may be configured to produce directional beams 102a-102n for communication with the communication devices 90a-90n. In an example, the beam former circuits of the phased array antenna panel 92 may be controlled to steer the beams 102a-102n, based on the phase and gain information received via the signal(s) CTRL, to track movement of the communication devices 90a-90n and/or switch between the communication devices 90a-90n.

The circuit 82 may implement a baseband processor circuit. The circuit 82 may be operational to process the information sent by and/or received in the intermediate-frequency signal IF. The circuit 82 may process the information within the RF transceiver system 80. The processing may include, but is not limited to, modulation/demodulation of the signal that contains the information and management of simultaneous communications between the RF transceiver system 80 and the multiple remote terminals 90*a*-90*n*.

The circuit 84 may implement one or more mixer circuits. The circuit 84 is generally operational to frequency convert (e.g., up-convert, down-convert, etc.) between an intermediate frequency used for the signal IF and the radio frequency, millimeter-wave frequency, or microwave frequency used for the signal RF. The frequency conversion may be based on one or more local oscillator frequencies provided by the signal LO. In various embodiments, the radio-frequency signal RF may be in a range of frequencies approximately centered around a center frequency of either 28 gigahertz (GHz) or 39 GHz (e.g., 24 GHz to 30 GHz or 37 GHz to 44 GHz). In embodiments implementing multiple intermediate frequencies, each intermediate frequency may cover a band from approximately 2 GHz to about 6 GHz (e.g., an approximately 4 GHz bandwidth). In an example, each local oscillator frequency may range from approximately 22 GHz to 26 GHz when the signal RF is approximately centered at 28 GHz. In another example, each local oscillator frequency may range from approximately 33 GHz to 37 GHz when the signal RF is approximately centered at 39 GHz. However, other frequency ranges may be implemented to meet the design criteria of a particular application.

The circuit 86 may implement a control circuit. In various embodiments, the circuit 86 may be implemented using one or more of an application specific integrated circuit (ASIC), controller, microprocessor, or circuitry configured accordingly. The circuit 86 is generally operational to control the operations of the phased array antenna panel 92. In some embodiments, the circuit 86 may determine the setting values used in each transceiver channel within the beam former circuits of the phased array antenna panel 92. The setting values may establish the geometry of the field(s) or beam(s) 102*a*-102*n*. In various embodiments, the circuit 86 may be implemented as one or more integrated circuits.

In an example, the circuit 88 may implement a table of values (e.g., embodied in a memory circuit). In an example, the table of values embodied in the circuit 88 may be configured to store multiple gain (G) values and multiple phase (P) values. The phase and gain values may be used by the transceiver channels in the beam former circuits of the phased array antenna panel 92 to establish the fields 102*a*-102*b*. The phase values and the gain values may be fetched from the circuit 88 via the signal PG and programmed into buffers associated with the beam former circuits of the phased array antenna panel 92 by the circuit 86. In various embodiments, the circuits 86 and 88 may be implemented either on the same integrated circuit or on different (separate) integrated circuits.

In an example, the phased array antenna panel 92 may be implemented comprising either single-polarization (or single-pole) antenna elements or dual-polarization (or dual-pole or di-pole) antenna elements. The phased array antenna panel 92 may be operational to transmit and receive wireless signals to and from the devices (or terminals) 90*a*-90*n*. The devices (or terminals) 90*a*-90*n* may be remotely located from the RF transceiver system 80. Sensitivity to the wireless signals may be determined by the fields 102*a*-102*n* created by the phased array antenna panel 92. The phased array antenna panel 92 may comprise a plurality of antenna elements and a plurality of beam former circuits. Each beam former circuit may implement a plurality of transceiver channels. Each transceiver channel generally comprises a transmit channel (or chain) and a receive channel (or chain). The transceiver channels may be coupled to the antenna elements by respective matching networks and an integrated TRX switch in accordance with an embodiment of the invention, in order to exchange corresponding bidirectional radio-frequency signals. The transceiver channels and antenna elements generally form a two-dimensional antenna network.

Figure 3:
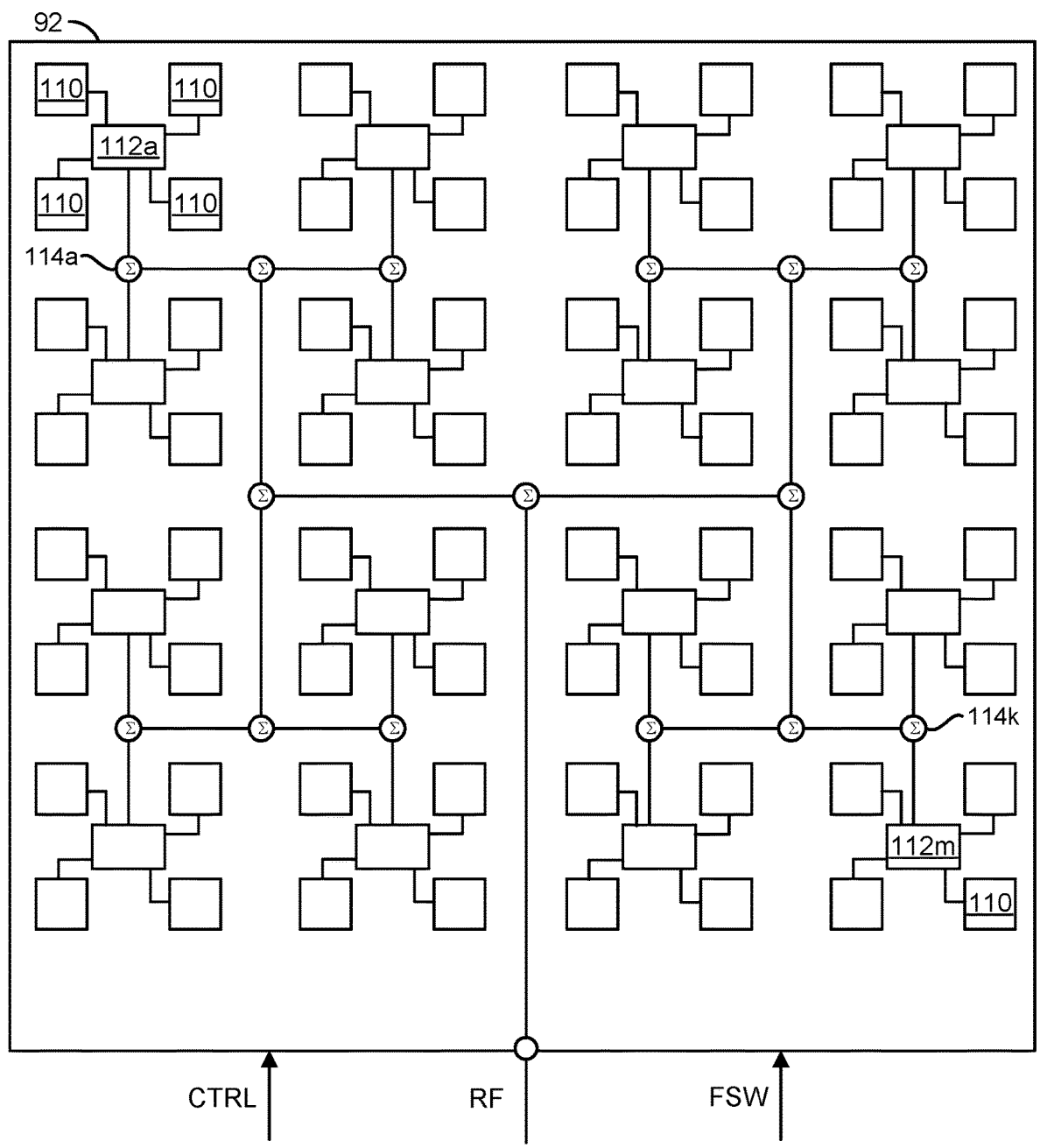
FIG. 3 is a diagram illustrating an example implementation of a single-polarization phased array antenna panel in accordance with an example embodiment of the invention.

Referring to FIG. 3, a diagram is shown illustrating an example implementation of a single-polarization version of the phased array antenna panel 92 in accordance with an embodiment of the invention. In an example, the phased array antenna panel 92 may comprise a number of antenna elements 110, a number of beam former circuits 112*a*-112*m*, and a number of blocks (or circuits) 114*a*-114*k*. In embodiments implementing a single-polarization phased array antenna panel, the antenna elements 110 generally are implemented as single polarization (or single-pole) antenna elements. Each of the circuits 112*a*-112*m* may implement a single-polarization beam former circuit. Each of the circuits 114*a*-114*k* may implement a combiner/splitter circuit. The circuits 112*a*-112*m*, and 114*a*-114*k* may be implemented with hardware, a combination of hardware and software, and/or simulated with software. In an example, the signal RF may be exchanged with one of the circuits 114*a*-114*k*. The signals FSW and CTRL may be exchanged with the circuits 112*a*-112*m*.

The antenna elements 110 in the phased array antenna panel 92 may be used for both transmission and reception. A physical positioning of the antenna elements 110 generally provides for two-dimensional (e.g., horizontal and vertical) control of the fields 102*a*-102*n*. In an example, the antenna elements 110 may be arranged in a 2-dimensional (e.g., N×N) grid pattern, where N is an integer value divisible by two. However, other dimensions of grid patterns may be implemented accordingly to meet design criteria of a particular implementation.

The circuits 112*a*-112*m* are generally operational to multiplex/demultiplex the signal RF with a number of the antenna elements 110. In various embodiments, each of the circuits 112*a*-112*m* may be mounted on a substrate of the phased array antenna panel 92 adjacent to (e.g., centered among) a number (or group) of the antenna elements 110. In an example, each circuit 112*a*-112*m* generally comprises a number of transceiver channels that are coupled to respective antenna elements 110. In an example, each circuit 112*a*-112*m* may be coupled to four adjacent antenna elements 110 (e.g., arranged in a 2×2 grid around each circuit 112*a*-112*m*). However, other numbers (e.g., 1, 2, 4, 18, etc.) of adjacent antenna elements 110 may be implemented to meet design criteria of a particular implementation.

The circuits 112*a*-112*m* may be configured to switch between a transmit mode and a receive mode in response to the signal FSW. In the transmit mode, the circuits 112*a*-112*m* may be operational to rapidly change setting values (e.g., phase values, gain values, etc.) used by the transceiver channels in order to steer the beams (or fields) 102*a*-102*n* and/or 104*a*-104*n* formed by the phased array antenna panel 92. In various embodiments, each of the circuits 112*a*-112*m* may comprise a memory, register store, and/or lookup table (LUT) that may be utilized to store a plurality of phase and gain values for each channel of the circuits 112*a*-112*m* corresponding to a plurality of beams in a predetermined beam space. In an example, the plurality of phase and gain values for each channel may be associated with an index corresponding to each beam of the beam space. In various embodiments, each of the circuits 112*a*-112*m* may be implemented as one or more integrated circuits (e.g., in a package or multi-chip module (MCM)).

In various embodiments, each of the circuits 114a-114k may be implemented as a combiner/splitter circuit. In an example, the circuits 114a-114k may be implemented as Wilkinson combiner/splitters. In various embodiments, the circuits 114a-114k may be coupled together to form a network that couples the circuits 112a-112m to an input/output of the phased array antenna panel 92 configured to present/receive the signal RF. In the transmit mode, the circuits 114a-114k are generally operational to distribute the power in the signal RF among the circuits 112a-112m. In the receive mode, the circuits 114a-114k may be operational to combine the power received in signals from the circuits 112a-112m into the signal RF. The circuits 112a-112n and 114a-114k are generally configured to provide a substantially equivalent path length between the RF input/output of the phased array antenna panel 92 and each of the circuits 112a-112m.

Figure 4:
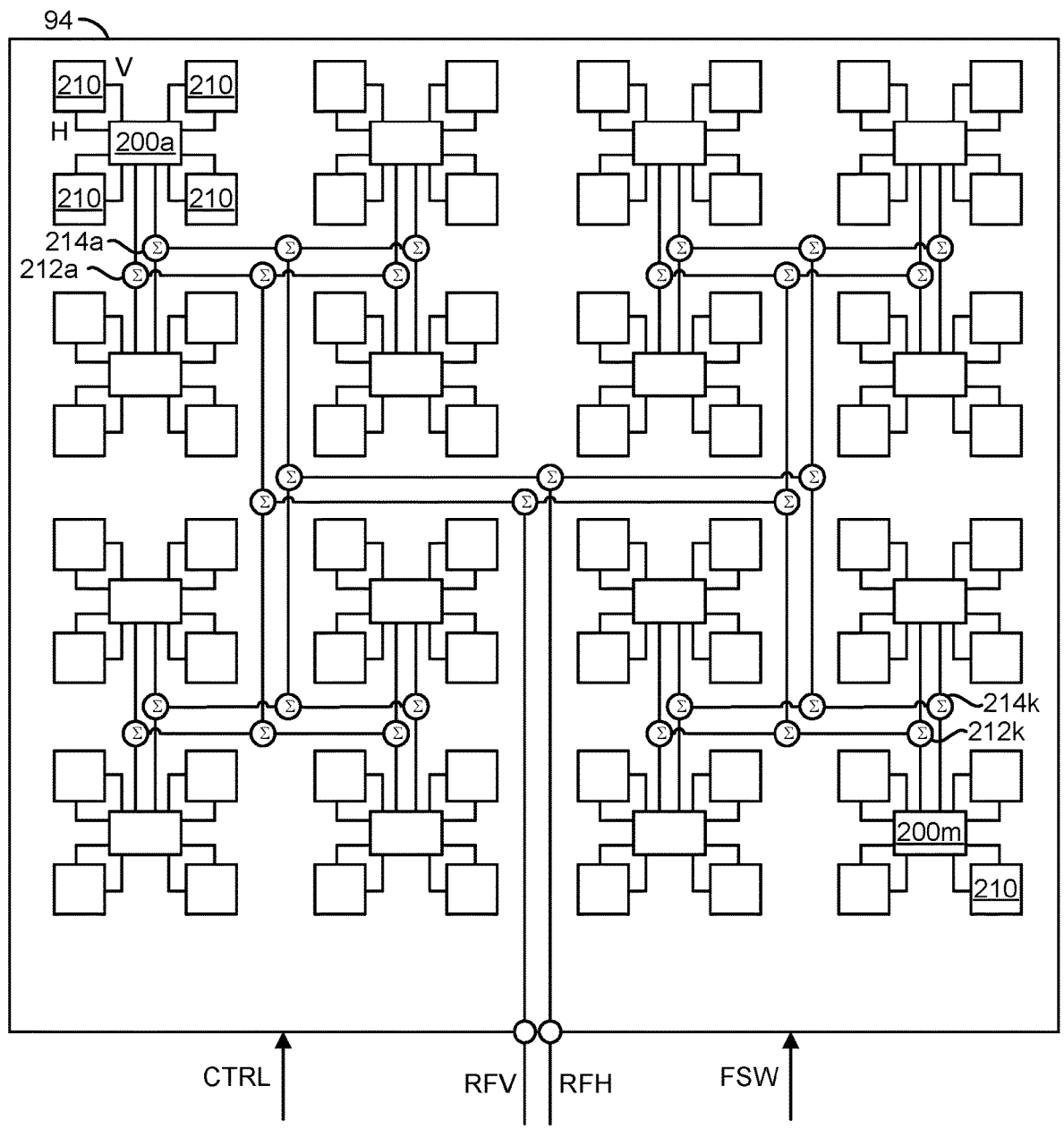
FIG. 4 is a diagram illustrating an example implementation of a dual-polarization phased array antenna panel in accordance with an example embodiment of the invention.

Referring to FIG. 4, a diagram is shown illustrating an example implementation of a dual-polarization phased array antenna panel 94 in accordance with another example embodiment of the invention. In embodiments implementing dual-polarization transceiver channels, the phased array antenna panel 94 may be used in place of the phased array antenna panel 92 of FIG. 1. In an example, the phased array antenna panel 94 may comprise a number of blocks (or circuits) 200a-200m, a number of blocks (or circuits) 210, a number of blocks (or circuits) 212a-212k, and a number of blocks (or circuits) 214a-214k. In embodiments implementing a dual-polarization phased array antenna panel, the blocks 210 generally are implemented as dual-polarization (or dual-pole or di-pole) antenna elements. Each of the circuits 200a-200m may implement a dual-polarization beam former circuit. Each of the circuits 212a-212k and 214a-214k may implement a combiner/splitter circuit. The circuits 200a-200m, 212a-212k, and 214a-214k may be implemented with hardware, a combination of hardware and software, and/or simulated with software. In embodiments implementing the dual-polarization phased array antenna panel 94, the signal RF may comprise a vertical polarized component (e.g., RFV) and a horizontal polarized component (e.g., RFH). In an example, the signal RFV may be exchanged with one of the circuits 212a-212k and the signal RFH may be exchanged with one of the circuits 214a-214k. The signals FSW and CTRL may be exchanged with the circuits 200a-200m.

The antenna elements 210 in the phased array antenna panel 94 may be used for both transmission and reception. A physical positioning of the antenna elements 210 generally provides for two-dimensional (e.g., horizontal and vertical) control of the fields 102a-102n. In an example, the antenna elements 210 may be arranged in a 2-dimensional (e.g., N×N) grid pattern, where N is an integer value divisible by 2. However, other dimensions of grid patterns may be implemented accordingly to meet design criteria of a particular implementation.

The circuits 200a-200m are generally operational to multiplex/demultiplex the signals RFV and RFH with a number of the antenna elements 210. In various embodiments, each of the circuits 200a-200m may be mounted on a substrate of the phased array antenna panel 94 adjacent to a number of the antenna elements 210. Each of the circuits 200a-200m may have respective horizontal (H) and vertical (V) input/outputs that may be coupled to corresponding horizontal (H) and vertical (V) input/outputs (or feeds) of the adjacent antenna elements 210. In an example, each circuit 200a-200m generally comprises a number of transceiver channels that are coupled to respective horizontal and vertical input/outputs. In an example, each circuit 200a-200m may be coupled to four adjacent antenna elements 210 (e.g., arranged in a 2×2 grid around each circuit 200a-200m).

The circuits 200a-200m may be configured to switch between a transmit mode and a receive mode in response to the signal FSW. In the transmit mode, the circuits 200a-200m may be operational to rapidly change setting values (e.g., phase values, gain values, etc.) used by the transceiver channels in order to steer the fields 102a-102n formed by the phased array antenna panel 94. In various embodiments, each of the circuits 200a-200m may comprise a memory, register store, and/or lookup table (LUT) that may be utilized to store a plurality of phase and gain values for each channel of the circuits 200a-200m corresponding to a plurality of beams in a predetermined beam space. In an example, the plurality of phase and gain values for each channel may be associated with an index corresponding to each beam of the beam space. In various embodiments, each of the circuits 200a-200m may be implemented as one or more integrated circuits (e.g., in a package or multi-chip module (MCM)). In an example, each of the circuits 200a-200m may be mounted on a substrate of the phased array antenna panel 94 adjacent to (e.g., centered among) the respective antenna elements 210.

In various embodiments, each of the circuits 212a-212k and 214a-214k may implement a combiner/splitter circuit. In an example, each of the circuits 212a-212k and 214a-214k may be implemented as a Wilkinson combiner/splitter circuit. The circuits 212a-212k may be coupled together to form a network that couples the circuit 200a-200m to an input/output of the phased array antenna panel 94 configured to present/receive the signal RFV. The circuits 214a-214k may be coupled together to form a network that couples the circuit 200a-200m to an input/output of the phased array antenna panel 94 configured to present/receive the signal RFH. In the transmit mode, the circuits 212a-212k and 214a-214k are generally operational to distribute the power in the signals RFV and RFH, respectively, among the circuits 200a-200m. In the receive mode, the circuits 212a-212k and 214a-214k may be operational to combine the power received in signals from the circuits 200a-200m, respectively, into the signals RFV and RFH. The circuits 212a-212n, 212a-212k, and 214a-214k are generally configured to provide a substantially equivalent path length between the RFV input/output and the RFH input/output of the phased array antenna panel 94 and each of the circuits 200a-200m.

Figure 5:
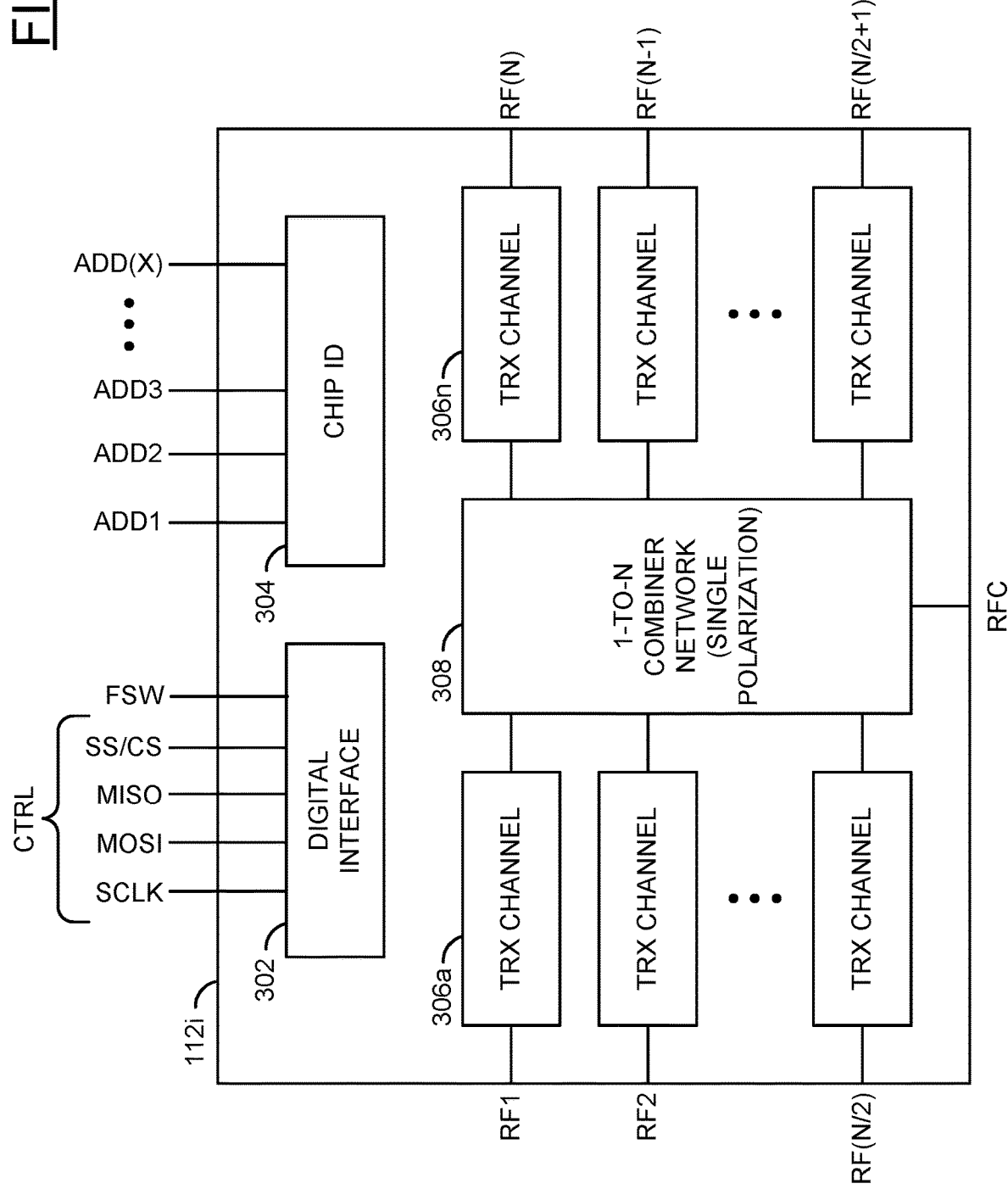
FIG. 5 is a diagram of a single-polarization beam former circuit in accordance with an example embodiment of the invention.

Referring to FIG. 5, a diagram is shown illustrating an example implementation of a single-polarization beam former circuit 112i in accordance with an example embodiment of the invention. In an example, the single-polarization beam former circuit 112i may be representative of the single-polarization beam former circuits 112a-112m of FIG. 2. In an example, the single-polarization beam former circuit 112i may have a digital interface configured to receive the signal FSW and the signal(s) CTRL, a common RF input/output port (RFC), and a number of antenna input/output ports (RF1-RFN). In general, any number (e.g., N) of antenna input/output ports (or channels) may be implemented accordingly to meet design criteria of a particular implementation.

In various embodiments, the signal RF may be presented/received by the common RF input/output RFC, and the antenna input/output ports RF1-RFN may be coupled to respective antenna elements 110. The single-polarization beam former circuit 112i generally implements a number of transceiver channels corresponding to the number of antenna input/output ports RF1-RFN. In various embodiments, each of the transceiver channels may comprise a respective transmit channel and a respective receive channel. The transceiver channels are generally configured to switch between transmitting or receiving based upon the signal FSW.

The single-polarization beam former circuit 112i generally implements a transmit mode and a receive mode. In an example, a state of the signal FSW may determine whether the transmit mode or the receive mode is active. In the transmit mode, the single-polarization beam former circuit 112i is generally configured to receive the radio frequency signal RF at the common input/output port RFC and present radio frequency signals at the antenna input/output ports RF1-RFN. The signals presented at each of the antenna input/output ports RF1-RFN are generated by the single-polarization beam former circuit 112i in response to the radio frequency signal RF received at the common input/output port RFC and a respective number of setting values (e.g., gain, phase, etc.) for each transceiver channel corresponding to each of the antenna input/output ports RF1-RFN. In the receive mode, the single-polarization beam former circuit 112i is generally configured to combine radio frequency signals received at the antenna input/output ports RF1-RFN for presentation as the signal RF at the common input/output port RFC.

The single-polarization beam former circuit 112i may comprise a block (or circuit) 302, a block (or circuit) 304, a number of blocks (or circuits) 306a-306n, and a block (or circuit) 308. The circuit 302 may implement an interface circuit. In various embodiments, the circuit 302 may implement a digital interface. The circuit 304 may implement a hard-wired address (e.g., chip ID) for the beam former circuit 112i. The circuits 306a-306n may implement transceiver (TRX) channels. The circuit 308 may implement a 1-to-N combiner/splitter network.

In an example, the signals FSW and CTRL are exchanged with the circuit 302. In an example, the circuit 302 may comprise a serial interface. The circuit 302 may be configured to be compliant with one or more serial interface standards including, but not limited to, serial peripheral interface (SPI), inter-integrated circuit (I2C), daisy chain, etc. In an example, the circuit 302 may be configured to allow programming and control of the single-polarization beam former circuit 112i using a serial communication link (or bus). In an example, the circuit 302 may be configured to program and control the circuits 306a-306n in response to the signals CTRL and FSW. In an example, the circuit 302 may control whether the circuits 306a-306n operate in a transmit mode or a receive mode in response to the signal FSW.

In an example, the circuit 302 may implement a 4-wire embedded SPI core. In an example, the circuit 302 may have a first pin that may receive a first signal (e.g., MOSI), a second pin that may present a second signal (e.g., MISO), a clock input pin that may receive a clock signal (e.g., SCLK), and a chip enable (or chip select) pin that may receive a signal (e.g., SS/CS). In an example, the signals MOSI, MISO, SCLK, and SS/CS may be components of the signal(s) CTRL. In an example, the circuit 302 may include a transmit/receive function switching pin that may receive the signal FSW. In an example, the signals MOSI, MISO, SCLK, and SS/CS may be configured to implement a 4-wire SPI protocol interface as summarized in the following TABLE 1:

TABLE 1

| SIGNAL | FUNCTION |
|---|---|
| MOSI | Master out Slave in |
| MISO | Master in Slave out |
| SCLK | Serial clock |
| SS/CS | Slave Select/Chip Select |

In an example, the circuit 304 may set a physical address of the beam former circuit 112i based upon hardware coded address bits (or pins). In various embodiments, a hard-wired address may be implemented having a number (e.g., X) of input bits (e.g., ADD1, ADD2, . . . , ADD(X)). In an example, the address may be implemented having six bits (or pins). In some embodiments, the hard-wired address may be set to predetermined logic levels (e.g., 0 or 1) by tying a number of address pins to predetermined supply voltages (e.g., GND, VSS, or VDD). In some embodiments, the hard-wired address bits may be hard coded within the chip implementing the beam former 112i. In some embodiments, the hard-wired address bits may be programmable within the chip implementing the beam former 112i during manufacturing. In an example, the hard-wired address bits may be programmed using fuses, anti-fuses, or other conventional techniques.

Figure 6:
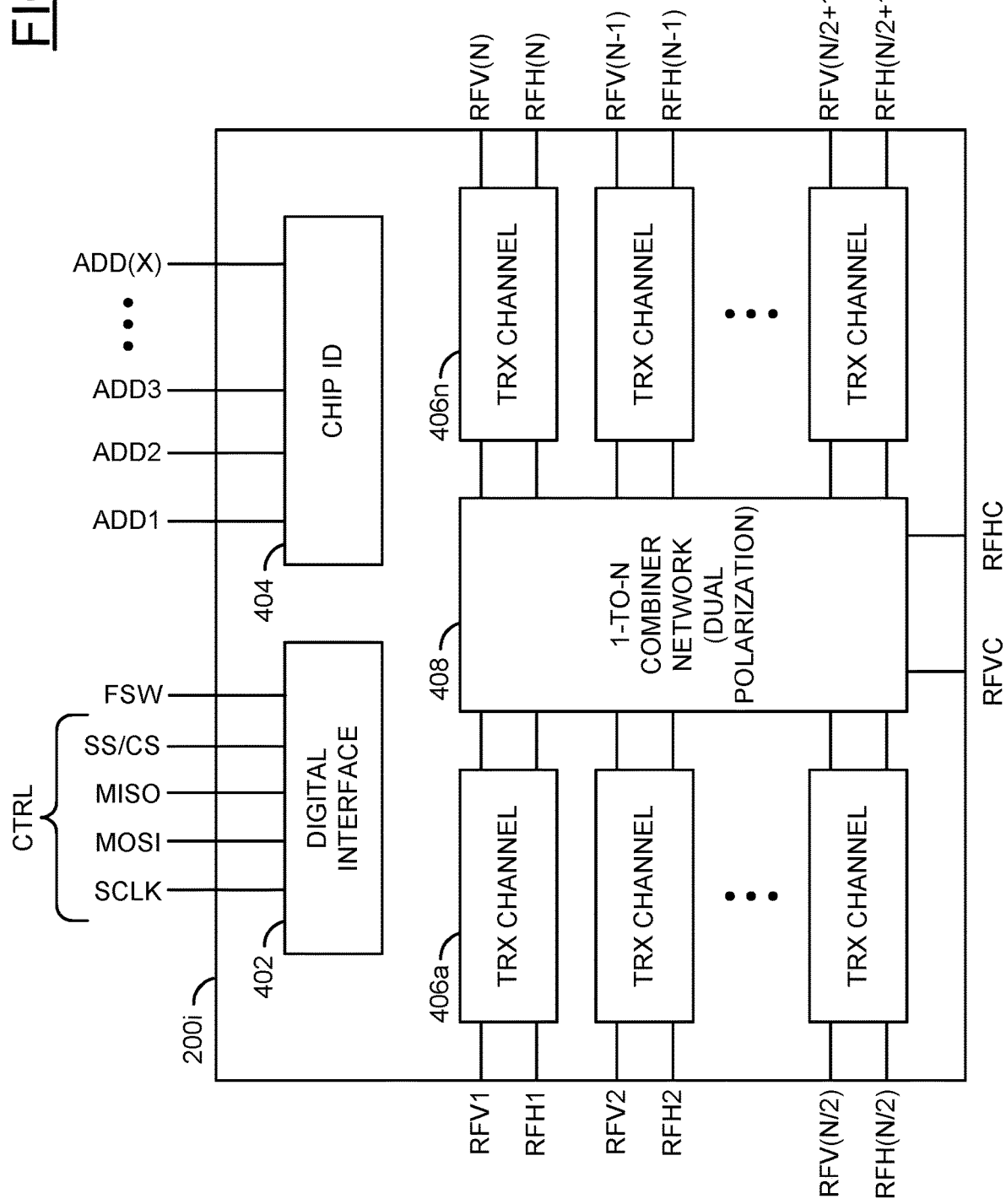
FIG. 6 is a diagram of a dual-polarization beam former circuit in accordance with an example embodiment of the invention.

Referring to FIG. 6, a diagram is shown illustrating an example implementation of a dual-polarization beam former circuit 200i in accordance with an example embodiment of the invention. In an example, the dual-polarization beam former circuit 200i may be representative of the dual-polarization beam former circuits 200a-200m of FIG. 3. In an example, the dual-polarization beam former circuit 200i may have a digital interface configured to receive the signal FSW and the signal(s) CTRL, a first common RF input/output port (RFVC), a second common RF input/output port (RFHC), a number of vertical antenna input/output ports (RFV1-RFV(N)), and a number of horizontal antenna input/output port (RFH1-RFH(N)). In general, any number (e.g., N) of vertical and horizontal antenna input/output ports (or channels) may be implemented accordingly to meet design criteria of a particular implementation.

In various embodiments, the signal RFV may be presented/received by the common RF input/output RFVC, the signal RFH may be presented/received by the common RF input/output RFHC, the vertical antenna input/output ports RFV1-RFV(N) may be coupled to corresponding vertical input/outputs of the respective antenna elements 210, and the horizontal antenna input/output ports RFH1-RFH(N) may be coupled to corresponding horizontal input/outputs of the respective antenna elements 210. The dual-polarization beam former circuit 200i generally implements a number (e.g., N) of transceiver channels corresponding to the number of pairs of vertical and horizontal antenna input/output ports (RFV1, RFH1), (RFV2, RFH2), . . . (RFV(N), RFH(N)). In various embodiments, each of the transceiver channels may comprise a respective transmit channel and a respective receive channel. The transceiver channels are generally configured to switch between transmitting or receiving based upon the signal FSW.

The dual-polarization beam former circuit 200i generally implements a transmit mode and a receive mode. In an example, a state of the signal FSW may determine whether the transmit mode or the receive mode is active. In the transmit mode, the dual-polarization beam former circuit 200i is generally configured to receive radio frequency signals at the common input/output ports RFVC and RFHC, and present radio frequency signals at the antenna input/output ports RFV1-RFV(N) and RFH1-RFH(N). The signals presented at each of the antenna input/output ports RFV1-RFV(N) and RFH1-RFH(N) are generated by the dual-polarization beam former circuit 200i in response to the radio frequency signals received at the common input/output ports RFVC and RFHC and a respective number of setting values (e.g., gain, phase, etc.) corresponding to each of the antenna input/output ports RFV1-RFV(N) and RFH1-RFH(N).

In an example, the dual-polarization beam former circuit 200i may comprise a block (or circuit) 402, a block (or circuit) 404, a number of blocks (circuits) 406a-406n, and a block (or circuit) 408. The circuit 402 may implement an interface circuit. In various embodiments, the circuit 402 may implement a digital interface. The circuit 404 may implement a hard-wired address (e.g., chip ID) for the beam former circuit 200i. The circuits 406a-406n may implement transceiver (TRX) channels. The circuit 408 may implement a 1-N dual-channel combiner/splitter network.

In an example, the signals FSW and CTRL are exchanged with the circuit 402. In an example, the circuit 402 may comprise a serial interface. The circuit 402 may be configured to be compliant with one or more serial interface standards including, but not limited to, serial peripheral interface (SPI), inter-integrated circuit (I2C), daisy chain, etc. In an example, the circuit 402 may be configured to allow programming and control of the dual-polarization beam former circuit 200i using a serial communication link (or bus). In an example, the circuit 402 may be configured to program and control the circuits 406a-406n in response to the signals CTRL and FSW. In an example, the circuit 402 may control whether the circuits 406a-406n operate in a transmit mode or a receive mode in response to the signal FSW.

In an example, the circuit 402 may implement a 4-wire embedded SPI core. In an example, the circuit 402 may have a first pin that may receive a first signal (e.g., MOSI), a second pin that may present a second signal (e.g., MISO), a clock input pin that may receive a clock signal (e.g., SCLK), and a chip enable (or chip select) pin that may receive a signal (e.g., SS/CS). In an example, the signals MOSI, MISO, SCLK, and SS/CS may be components of the signal(s) CTRL. In an example, the circuit 402 may include a transmit/receive function switching pin that may receive the signal FSW. In an example, the signals MOSI, MISO, SCLK, and SS/CS may be configured to implement the 4-wire SPI protocol interface as summarized in the TABLE 1 above.

In an example, the circuit 404 may set a physical address of the dual-polarization beam former circuit 200i based upon hardware coded address bits (or pins). In various embodiments, a hard-wired address may be implemented having a number (e.g., X) of input bits (e.g., ADD1, ADD2, . . . , ADD(X)). In an example, the address may be implemented having six bits (or pins). In some embodiments, the hard-wired address may be set to predetermined logic levels (e.g., 0 or 1) by tying a number of address pins to predetermined supply voltages (e.g., GND, VSS, or VDD). In some embodiments, the hard-wired address bits may be hard coded within the chip implementing the beam former 200i during manufacturing. In some embodiments, the hard-wired address bits may be programmed within the chip implementing the beam former 200i. In an example, the hard-wired bits may be programmed using fuses, anti-fuses, or other conventional techniques.

Figure 7:
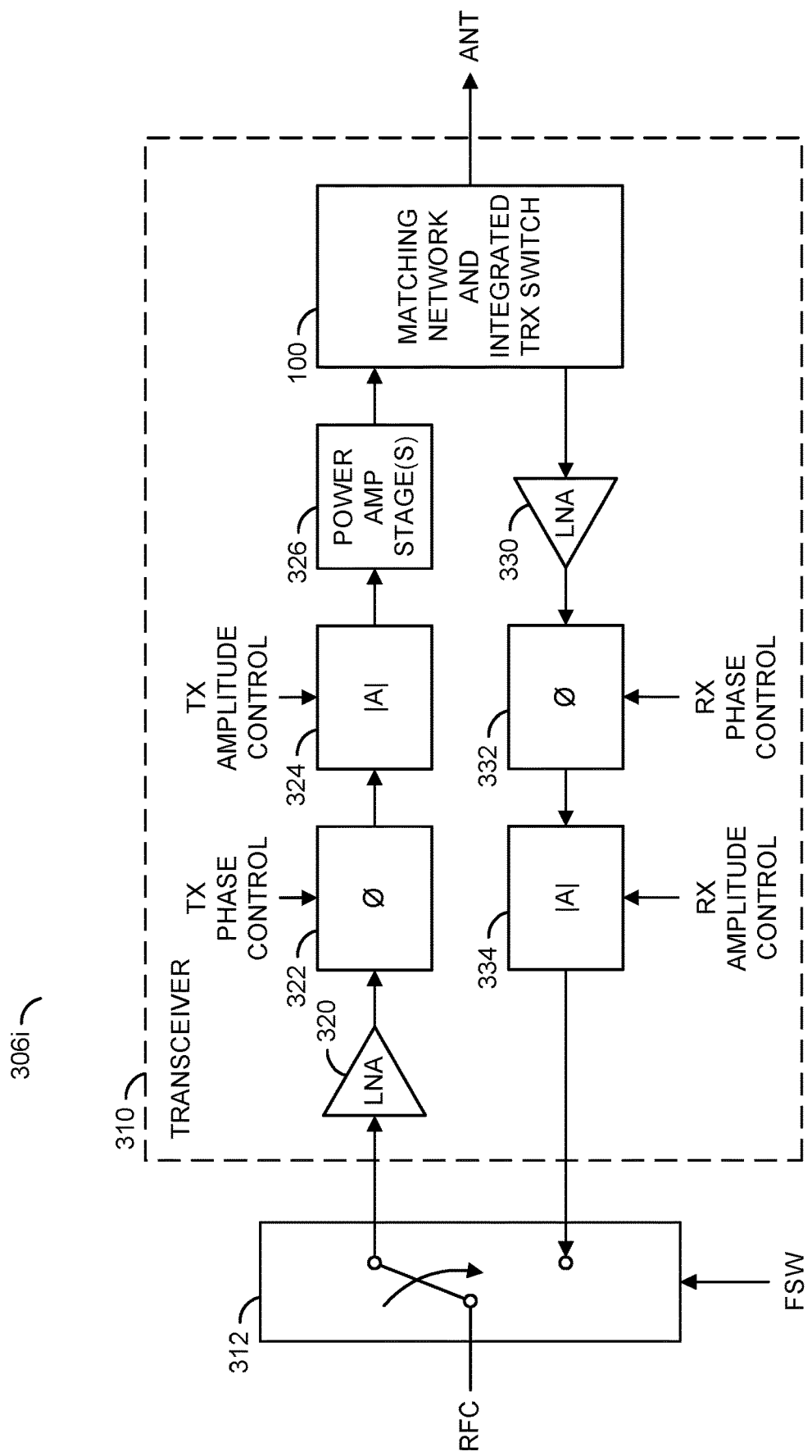
FIG. 7 is a block diagram illustrating an example implementation of a transceiver circuit of FIGS. 5 and 6.

Referring to FIG. 7, a block diagram of a transceiver circuit 306i is shown illustrating an example implementation of the transceiver circuits of FIGS. 5 and 6. In an example, the transceiver circuit 306i may be representative of the single-polarization beam former transceiver circuits (or channels) 306a-306d of FIG. 5. In another example, the transceiver circuit 306i may be representative of either horizontal or vertical beam former transceiver circuits (or channels) of FIG. 6. In an example embodiment, the circuit 306i may comprise a block (or circuit) 310 and a block (or circuit) 312. In an example embodiment, the circuit 310 may implement a transceiver circuit. The block 312 may implement a transmit-receive (T/R) RF switch. A transceiver circuit is generally capable of both transmitting and receiving signals of a communication channel. In various embodiments, the circuit 310 may be capable of transmitting and receiving radio frequency (RF), microwave, and/or millimeter-wave signals.

In various embodiments, the circuit 310 may be representative of transceiver circuits utilized in applications including, but not limited to cellular base stations (e.g., 2G, 3G, 4G, 5G, etc.), wireless communication systems, wireless local area networks (WLANs), wireless backhaul channels, broadband repeaters, community antenna television (CATV) networks, macro cells, micro cells, pico cells, femto cells, mobile devices (MDs), and/or portable handheld devices (UEs). In some embodiments, the circuit 310 may be representative of a radar application including, but not limited to target detection, ranging, and/or through-wall imaging. In an example, the transceiver circuit 310 generally comprises both a transmitter chain and a receiver chain. Both the transmitter chain and the receiver chain may comprise radio frequency (RF) amplifiers.

In an example, the transmitter chain may include an input amplifier 320, a variable (programmable) phase shifter 322, a variable (programmable) attenuator 324, and one or more output amplifier stages 326. An output of the transmitter chain may be coupled to an input of a matching network and integrated transmit-receive (TRX) switch circuit 100 in accordance with an embodiment of the invention. In an example, the input amplifier 320 may be implemented as a low noise amplifier (LNA). The output amplifier stages 326 may include drivers, pre-amplifiers, and/or power amplifiers (PAs). In an example, the receiver chain may include a low noise amplifier (LNA) 330, a variable (programmable) phase shifter 332, and a variable (programmable) attenuator 334. An output of the circuit 100 may be coupled to an input of the low noise amplifier (LNA) 330. In various embodiments, the RF switch 312, the variable phase shifter 322, the variable attenuator 324, the variable phase shifter 332, and the variable attenuator 334 may be implemented using conventional techniques.

In an example, an input of the transmitter chain and an output of the receiver chain may be coupled to a transmission line or an RF transceiver system by the RF switch 312. In an example, an output of the transmitter chain and an input of the receiver chain may be coupled to a transmission line or an antenna (ANT) by circuit 100. In various embodiments, the circuit 100 may implement an output matching network for the transmitter chain, an input matching network for the receiver chain, and an integrated TRX switch in accordance with an embodiment of the invention. The integrated TRX switch of the circuit 100 generally has a topology that may be absorbed into the impedance matching elements of the power amplifier stages 326 and the low noise amplifier 330. Integration of the TRX switch topology in accordance with embodiments of the invention with the impedance matching elements of the power amplifier (PA) stages 326 and the low noise amplifier 330 generally results in minimum signal loss (e.g., output power and PAE degradation in the transmit chain or noise factor (NF) degradation in the receive chain). Integration of the TRX switch topology in accordance with embodiments of the invention with the impedance matching elements of the power amplifier stage 326 and the low noise amplifier 330 generally reduces chip area as well (when compared with conventional high-isolation TRX switches).

In various embodiments, the TRX switch topology in accordance with embodiments of the invention is particularly suitable for, but not limited to, differential or transformer based transmitter and receiver implementations. The TRX switch topology generally does not include any component between the output of the transmitter chain (e.g., the output of the PA 326) and the input/output of the transceiver circuit. The TRX switch topology may, therefore, be implemented without special switch components that need to tolerate high voltage swings. Because high breakdown voltage switch components are not needed, the TRX switch topology in accordance with embodiments of the invention is particularly suitable for implementation in advanced short-channel bulk or silicon-on-insulator (SOI) complementary metal oxide semiconductor (CMOS) technology with low breakdown voltage (e.g., below one volt).

Although the TRX switch topology in accordance with embodiments of the invention may be implemented using a minimum apparent number of elements, the TRX switch topology generally provides high isolation between the transmitter chain and the receiver chain circuits. Although the TRX switch topology in accordance with embodiments of the invention may be highly integrated with the transmitter chain and receiver chain circuits, the TRX switch topology may be designed independently of the transmitter chain and receiver chain circuits and absorbed into the respective impedance matching networks at any stage of development. In general, co-design and/or co-optimization are not necessary.

Figure 8:
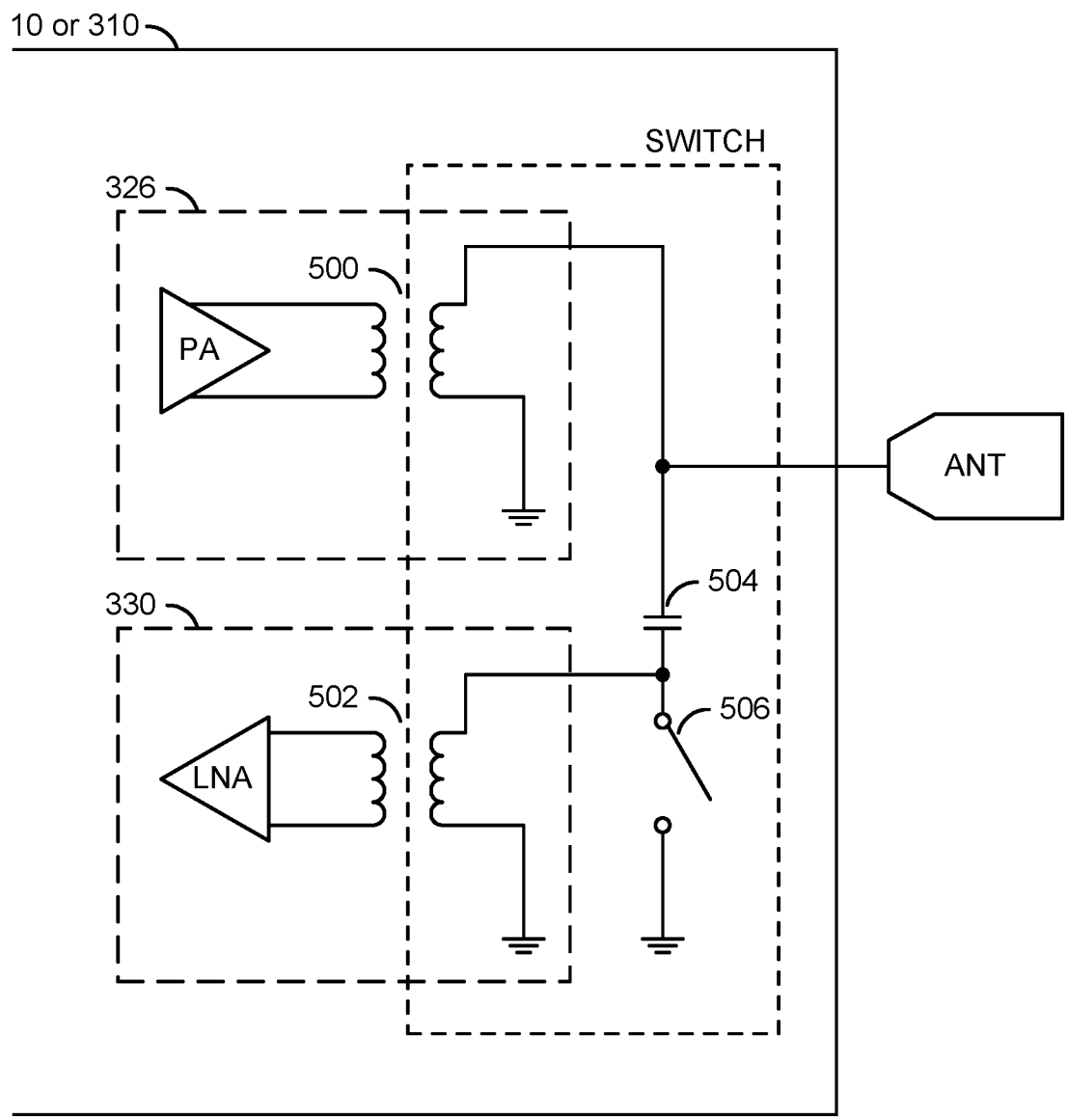
FIG. 8 is a diagram illustrating an example implementation of a transmit-receive (TRX) switch topology in accordance with a differential embodiment.

Referring to FIG. 8, a diagram is shown illustrating an example implementation of the TRX switch circuit 100 in accordance with a differential embodiment. In an example, an output transformer 500 and an input transformer 502 of a differential power amplifier 326 of the transmitter chain and a differential low noise amplifier 330 of the receiver chain, respectively, may be configured to absorb and implement the TRX switch topology in accordance with an embodiment of the invention. In an example, an output of the output transformer 500 may be directly connected to an input/output of the transceiver circuit (e.g, 10 or 310).

A series capacitor 504 may be connected between an input of the input transformer 502 and the output of the output transformer 500. A shunt switch 506 may be connected in parallel with the input winding of the input transformer 502. In an example, each of the transformers 500 and 502 at the output matching network of the transmitter and input matching network of the receiver, respectively, may be implemented with a planar coupled spiral transmission line on the chip or on a printed circuit board. In an example, the capacitor 504 may be implemented as a metal-insulator-metal (MIM) capacitor or a finger capacitor on the chip or as a ceramic capacitor on the printed circuit board. The capacitor 504 may also be implemented with one or more MOS devices.

Figure 9:
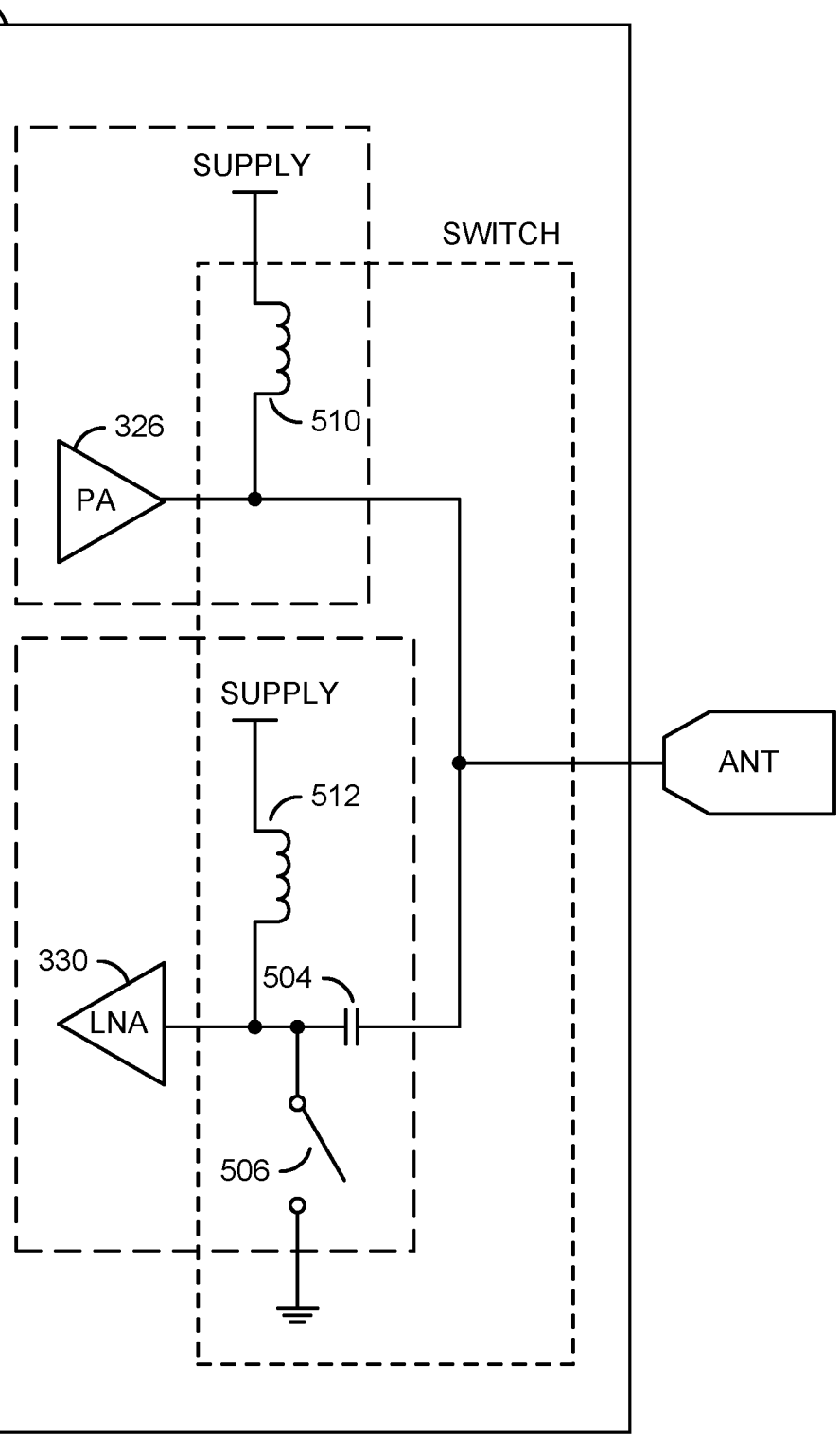
FIG. 9 is a diagram illustrating another example implementation of the TRX switch topology in accordance with a single-ended embodiment.

Referring to FIG. 9, a diagram is shown illustrating another example implementation of the TRX switch 100 utilizing a topology in accordance with a single-ended embodiment of the invention. In an example, an impedance matching network and bias choke (or inductor) 510 of the power amplifier 326 of the transmitter chain and an impedance matching network and bias choke (or inductor) 512 of the low noise amplifier 330 of the receiver chain may be configured to absorb and implement the TRX switch topology in accordance with an embodiment of the invention. In an example, the output of the power amplifier 326 may be directly connected to the input/output of the transceiver circuit 10 or 310. The series capacitor 504 may be connected between an input of the low noise amplifier 330 and the output of the power amplifier 326. The shunt switch 506 may be connected between the input of the low noise amplifier 330 and a circuit ground potential of the transceiver circuit 310. Each of the bias chokes (or inductors) 510 and 512 may be implemented with planar spiral transmission line on the chip or on the printed circuit board. The capacitor 504 may be implemented as a MIM capacitor or a finger capacitor on the chip or as a ceramic capacitor on the printed circuit board. The capacitor 504 may also be implemented with one or more MOS devices.

Figure 10:
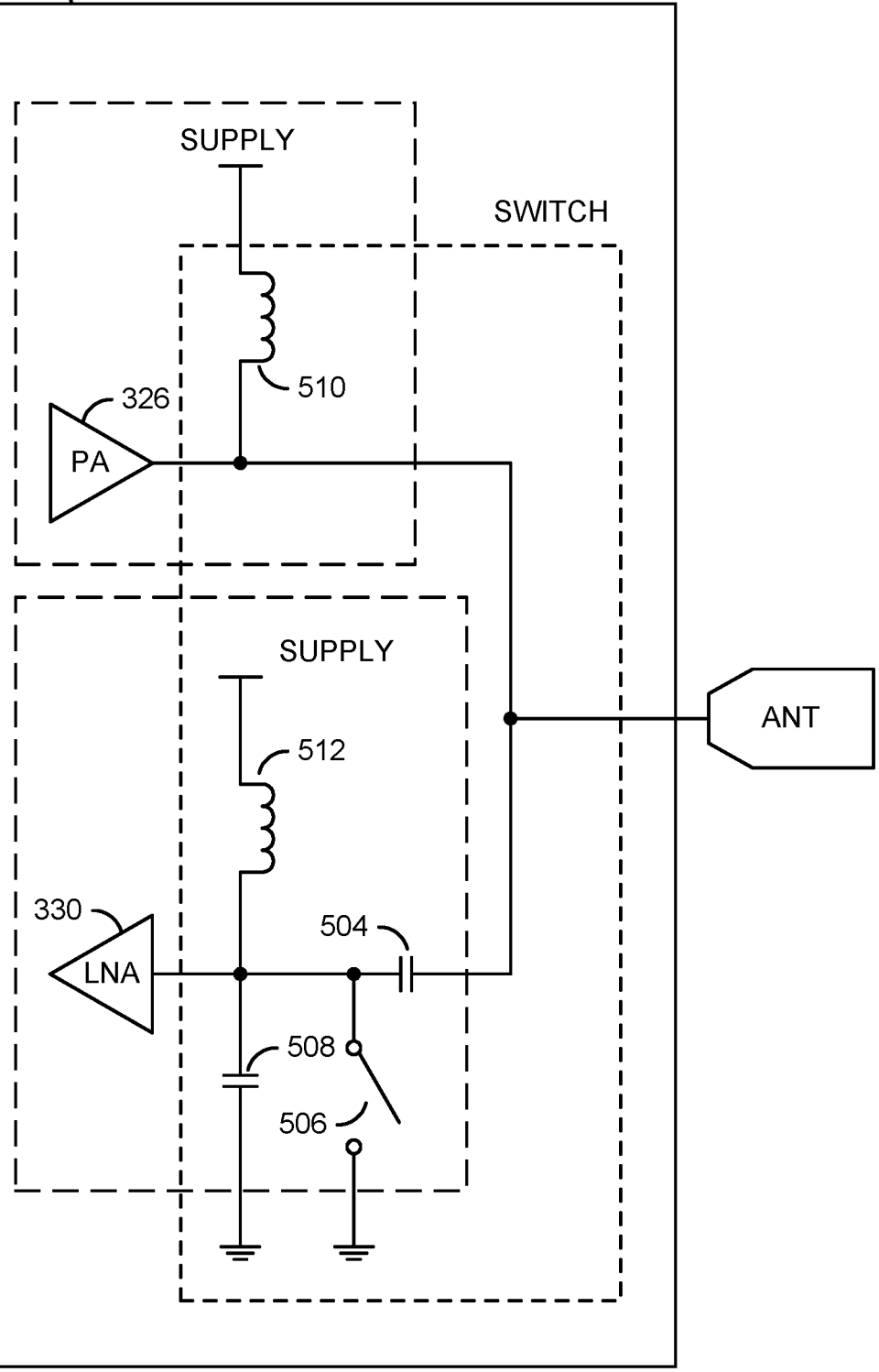
FIG. 10 is a diagram illustrating yet another example implementation of the TRX switch topology in accordance with a single-ended embodiment.

Referring to FIG. 10, a diagram is shown illustrating another example implementation of the TRX switch 100 utilizing a topology in accordance with a single-ended embodiment of the invention. In an example, a shunt capacitor 508 may be added to the implementation of FIG. 9. In an example, the impedance matching network and bias choke 510 of the power amplifier 326 of the transmitter chain and the impedance matching network and bias choke 512 of the low noise amplifier 330 of the receiver chain may be configured to absorb and implement the TRX switch topology in accordance with embodiments of the invention. In an example, the output of the power amplifier 326 may be directly connected to the input/output of the transceiver circuit 10 or 310.

In various embodiments, the series capacitor 504 may be connected between an input of the low noise amplifier 330 and the output of the power amplifier 326. The shunt switch 506 may be connected between the input of the low noise amplifier 330 and the circuit ground potential of the transceiver circuit 310. The shunt capacitor 508 may be connected between the input of the low noise amplifier 330 and the circuit ground potential of the transceiver circuit 310. Each of the bias chokes (or inductors) 510 and 512 may be implemented with planar spiral transmission line on the chip or printed circuit board. The capacitors 504 and 508 may be implemented as MIM capacitors or finger capacitors on the chip or ceramic capacitors on the printed circuit board. The capacitors 504 and 508 may also be implemented with one or more MOS devices. In some embodiments, the parasitic capacitance of the switch 506 may be used to implement all or part of the shunt capacitor 508.

Figure 11:
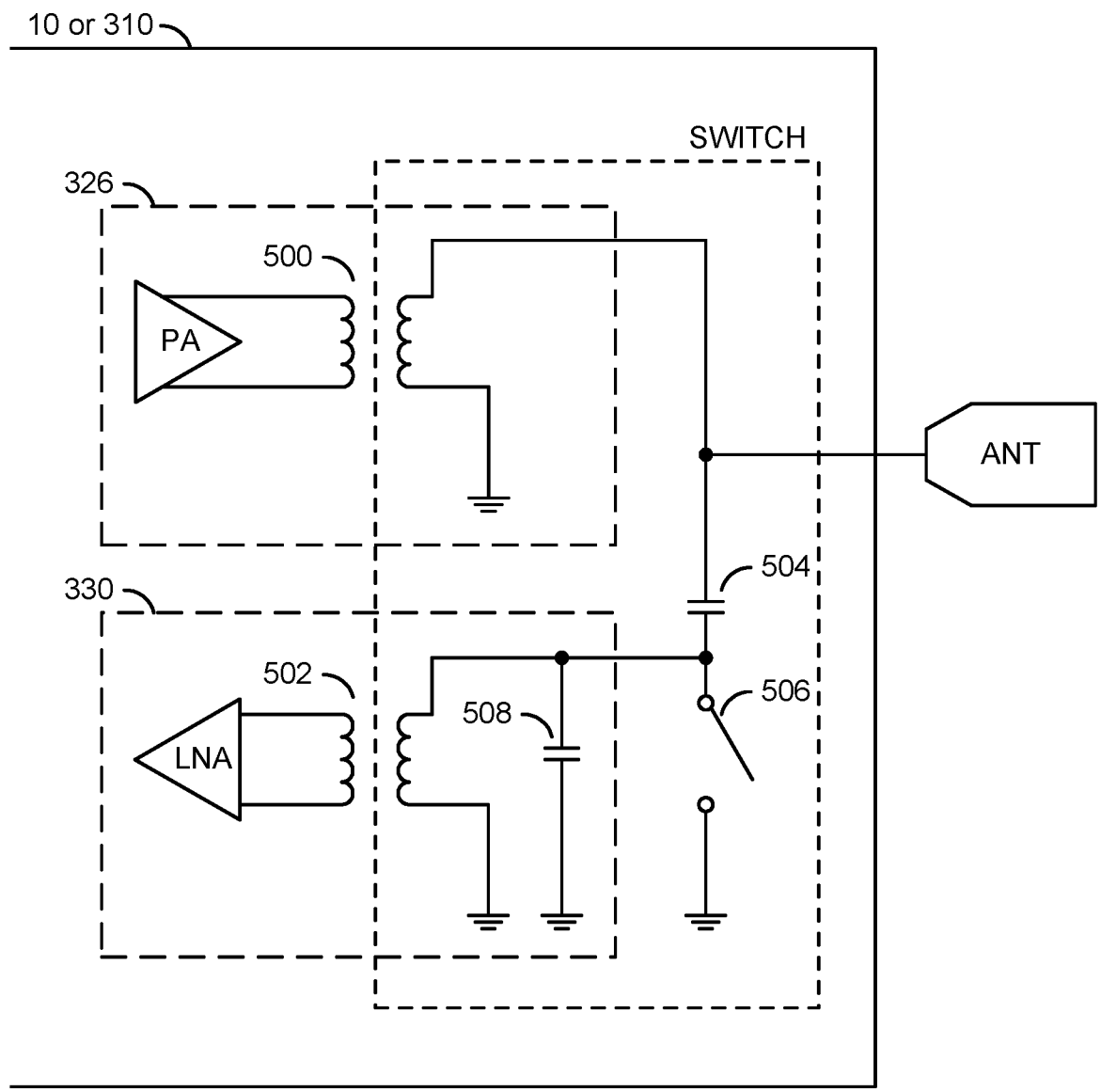
FIG. 11 is a diagram illustrating still another example implementation of the TRX switch topology in accordance with a differential embodiment.

Referring to FIG. 11, a diagram is shown illustrating still another example implementation of the TRX switch 100 utilizing a topology in accordance with a differential embodiment of the invention. In an example, the shunt capacitor 508 may be added to the implementation illustrated in FIG. 8. The shunt capacitor 508 may be used to adjust the optimum impedance presented to the input of the receiver chain to improve the noise behavior. The capacitor 508 generally does not affect the performance of the transmitter chain (e.g., switch 506 closed). In an example, the output transformer 500 of the differential power amplifier 326 of the transmitter chain and the input transformer 502 of the differential low noise amplifier 330 of the receiver chain may be configured to absorb and implement the TRX switch topology in accordance with embodiments of the invention.

In an example, the output of the output transformer 500 may be directly connected to an input/output of the transceiver circuit 10 or 310. The series capacitor 504 may be connected between the input of the input transformer 502 and the output of the output transformer 500. The shunt switch 506 and the shunt capacitor 508 may be connected in parallel with the input winding of the input transformer 502 may be implemented with planar coupled spiral transmission line on the chip or on the printed circuit board. The capacitors 504 and 508 may be implemented as MIM capacitors or finger capacitors on the chip or as ceramic capacitors on the printed circuit board. The capacitors 504 and 508 may also be implemented with one or more MOS devices. The parasitic capacitance of the switch 506 may be used to implement all or part of the shunt capacitor 508.

Referring to FIG. 12, a diagram of a graph 800 is shown illustrating simulated voltage waveforms of the TRX switch of FIG. 11. A waveform 802 illustrates a voltage level at a node formed by the connection of the output of the transformer 500 and the input/output of the transceiver 10 or 310. A waveform 804 illustrates a voltage level at a node formed by the connection of the input of the transformer 502, the series capacitor 504, the shunt switch 506, and the shunt capacitor 508. In general, the TRX switch topology in accordance with embodiments of the invention does not introduce distortion into the output signal of the transceiver channel 10 or 310. In addition, the shunt switch 506 is not exposed to high voltage swings of the transmitter channel operation and, therefore, may be implemented with low voltage submicron transistor technologies (e.g., silicon on insulator CMOS transistors with breakdown voltage below one volt).

Although embodiments of the invention have been described in the context of a RF application, the present invention is not limited to RF applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G, 5G) specifications or future specifications.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a transceiver circuit;
a series capacitor; and
a shunt switch, wherein (i) said transceiver circuit comprises a transmit chain including an output matching network comprising a first transformer and a receive chain including an input matching network comprising a second transformer, (ii) an output of said output matching network is connected directly to an input/output of said transceiver circuit, (iii) said series capacitor is connected between an input of said input matching network and said output of said output matching network, (iv) said shunt switch is connected between said input of said input matching network and a circuit ground potential of said transceiver circuit, (v) said transceiver circuit, said series capacitor, and said shunt switch are part of a beam former integrated circuit, (vi) said input/output of said transceiver circuit is connected to one of a plurality of antenna elements making up a phased array antenna, and (vii) said input/output of said transceiver circuit is switched between said transmit chain and said receive chain using only said shunt switch connected between said input of said input matching network and said circuit ground potential of said transceiver circuit.

2. The apparatus according to claim 1, wherein said beam former integrated circuit comprises a plurality of transceiver circuits with each including a respective series capacitor and a respective shunt switch.

3. The apparatus according to claim 2, wherein each of said plurality of transceiver circuits further comprise a respective shunt capacitor connected in parallel with said respective shunt switch.

4. The apparatus according to claim 1, further comprising a shunt capacitor connected in parallel with said shunt switch.

5. The apparatus according to claim 4, wherein a value of said shunt capacitor is selected to adjust an impedance presented to an input of the receive chain to improve noise behavior.

6. The apparatus according to claim 5, wherein said value of said shunt capacitor is selected taking into account a parasitic capacitance of said shunt switch.

7. The apparatus according to claim 1, wherein said shunt switch comprises one or more transistors.

8. The apparatus according to claim 7, wherein said shunt switch comprises a stacked transistor device.

9. The apparatus according to claim 7, wherein said transistors are implemented using at least one of complementary metal oxide semiconductor (CMOS) technology, high electron mobility transistor (HEMT) technology, pseudomorphic high electron mobility transistor (pHEMT) technology, and silicon-on-insulator technology.

10. The apparatus according to claim 7, wherein said transistors are implemented using a low voltage submicron transistor technology having a low breakdown voltage.

11. The apparatus according to claim 1, wherein said series capacitor and said shunt switch are implemented within a footprint of said input matching network and said output matching network of said transceiver circuit.

12. The apparatus according to claim 1, wherein:
said series capacitor comprises at least one of a metal-insulator-metal capacitor, a finger capacitor, and a ceramic capacitor.

13. The apparatus according to claim 1, wherein said first transformer and said second transformer are implemented as planar coupled spiral transmission lines.

14. The apparatus according to claim 1, wherein said series capacitor comprises one or more metal-oxide semiconductor devices.

15. The apparatus according to claim 1, wherein an input winding of said second transformer is connected in parallel with said shunt switch.

16. The apparatus according to claim 1, wherein a differential output of a power amplifier of said transmit chain is connected to an input winding of said first transformer and an output winding of said second transformer is connected to a differential input of a low noise amplifier of said receive chain.

17. A method of switching a transmission medium between transmitter and receiver channels of a transceiver circuit comprising the steps of:
  connecting an output of an output matching network of a transmitter chain of said transceiver circuit directly to an input/output of said transceiver circuit, wherein said output matching network comprises a first transformer;
  connecting a series capacitor between an input of an input matching network of a receiver chain of said transceiver circuit and said output of said output matching network, wherein said input matching network comprises a second transformer; and
  connecting a shunt switch between said input of said input matching network and a circuit ground potential of said transceiver circuit, wherein (i) said transceiver circuit, said series capacitor, and said shunt switch are part of a beam former integrated circuit, (ii) said input/output of said transceiver circuit is connected to one of a plurality of antenna elements making up a phased array antenna, and (iii) said input/output of said transceiver circuit is switched between said transmitter chain and said receiver chain using only said shunt switch connected between said input of said input matching network and said circuit ground potential of said transceiver circuit.

18. The method according to claim 17, further comprising connecting a shunt capacitor in parallel with said shunt switch.

19. The method according to claim 18, wherein a value of said shunt capacitor is selected to adjust an impedance presented to an input of the receiver chain to improve noise behavior.

20. The method according to claim 19, wherein said value of said shunt capacitor is selected taking into account a parasitic capacitance of said shunt switch.

* * * * *